(12) United States Patent
Tanino et al.

(10) Patent No.: US 6,187,279 B1
(45) Date of Patent: *Feb. 13, 2001

(54) SINGLE CRYSTAL SIC AND METHOD OF PRODUCING THE SAME

(75) Inventors: Kichiya Tanino; Masanobu Hiramoto, both of Sanda (JP)

(73) Assignee: Nippon Pillar Packing Co., Ltd., Osaka (JP)

( * ) Notice: Under 35 U.S.C. 154(b), the term of this patent shall be extended for 0 days.

This patent is subject to a terminal disclaimer.

(21) Appl. No.: 09/281,980

(22) Filed: Mar. 31, 1999

(30) Foreign Application Priority Data

Apr. 13, 1998 (JP) .................................... 10-101492

(51) Int. Cl.[7] .............................. C30B 1/04; C30B 29/36
(52) U.S. Cl. .................................. 423/345; 117/1; 117/7; 117/9; 117/951
(58) Field of Search .............................. 423/345; 117/1, 117/3, 9, 951, 7

(56) References Cited

U.S. PATENT DOCUMENTS

| | | | |
|---|---|---|---|
| 4,419,336 | * 12/1983 | Kuriakose | 423/345 |
| 4,686,032 | * 8/1987 | Seider et al. | 209/8 |
| 6,020,600 | * 2/2000 | Miyajima et al. | 257/76 |
| 6,053,973 | * 4/2000 | Tanino et al. | 117/4 |

* cited by examiner

Primary Examiner—Benjamin L. Utech
Assistant Examiner—Donald L. Champagne
(74) Attorney, Agent, or Firm—Jones, Tullar & Cooper, P.C.

(57) ABSTRACT

In single crystal SiC according to the present invention, a single crystal α-SiC substrate and a polycrystalline β-SiC plate are laminated to each other for fixation, the single crystal α-Sic substrate and the polycrystalline β-SiC plate are subjected to heat treatment under an inert gas atmosphere and a saturated SiC vapor atmosphere, whereby the single crystallization owing to solid-phase transformation of the polycrystalline β-SiC plate and a progress of the single crystallization to a surface direction wherein a contact point is regarded as a starting point make a whole surface of layer of the polycrystalline β-SiC plate grow efficiently into a single crystal integrated with the single crystal α-SiC substrate, whereby it is possible to produce single crystal SiC having high quality with high productivity, which is substantially free from lattice defects and micropipe defects.

4 Claims, 3 Drawing Sheets

SINGLE CRYSTAL SIC AND METHOD OF PRODUCING THE SAME

BACKGROUND OF THE INVENTION

1. Field of the Invention

The present invention relates to a single crystal SiC and a method of producing the same, and more particularly to a single crystal SiC which is used as a semiconductor substrate wafer for a light-emitting diode, an X-ray optical element such as a monochromatic sorter, a high-temperature semiconductor electronic element, and a power device, and also to a method of producing the same.

2. Description of the Prior Art

SiC (silicon carbide) is superior in heat resistance and mechanical strength, and also has good resistance to radiation. In addition, it is easy to perform the valence control of electrons and holes by doping an impurity. Moreover, the SiC has a wide band gap (for example, a single crystal 6H-SiC has a band gap of about 3.0 eV, and a single crystal 4H-SiC has a band gap of 3.26 eV). Therefore, it is possible to realize large capacity, high frequency, high dielectric strength, and high resistance to environments which cannot be realized by existing semiconductor materials such as Si (silicon) and GaAs (gallium arsenide). For these reasons, the single crystal SiC receives attention and is expected as a semiconductor material for a next-generation power device.

As a method of growing (producing) a single crystal SiC of this type, known are a method in which the single crystal SiC is grown by the sublimation and recrystallization method using a seed crystal, and a high temperature epitaxial method in which, in the case of a high temperature, epitaxial growth is conducted on a silicon substrate by using chemical vapor deposition (namely, CVD), thereby growing a single crystal cubic SiC (β-SiC).

In the above-described conventional production methods, however, the sublimation and recrystallization method in which it is difficult to control growth of the single crystal owing to gas phase crystal growth under a high temperature, has problems such as lattice defects and micropipe defects, wherein pin holes having a diameter of several microns and passing through the crystal in the growing direction remain at about 100 to 1,000/cm$^2$ in a growing crystal. Such pinholes are called micropipe defects and cause a leakage current when a semiconductor device is fabricated, thus making it difficult to obtain the single crystal SiC having excellent quality. Moreover, in the high-temperature epitaxial method, the temperature of the substrate is high and it is also required to produce a high-pure reducing atmosphere. Therefore, the method has a problem in that it is difficult to conduct the method from the view point of installation. Furthermore, the method has another problem in that, because of epitaxial growth, the crystal growth rate is slow in the degree of several um per hour, thus resulting in a problem of extremely poor productivity of the single crystal SiC.

These problems block a practical use of the single crystal SiC which has superior characteristics as compared with other existing semiconductor materials such as Si and GaAs as described above.

SUMMARY OF THE INVENTION

The present invention has been conducted in view of the above mentioned circumstances and problems. The objects of the present invention are to provide an extremely high quality single crystal SiC in which lattice defects and micropipe defects do not exists, and a method of producing a single crystal SiC for making it possible to produce such a high quality single crystal SiC with high productivity, which can expedite the practical use of the single crystal as a semiconductor material.

In order to achieve the above objects, the single crystal SiC has features according to the present invention in which, in a state wherein a single crystal SiC substrate and a polycrystalline SiC plate are laminated to each other so as to be fixed, the single crystal SiC substrate and the polycrystalline SiC plate are subjected to heat treatment under an inert gas atmosphere equal to or lower than an atmospheric pressure and under a saturated SiC vapor atmosphere, whereby the polycrystalline SiC plate is solid-phase-transformed into the single crystal, thereby growing a single crystal integrated with the single crystal SiC substrate.

Moreover, in order to attain the above objects, the method of producing the single crystal SiC according to the present invention comprises the steps of:

laminating a single crystal SiC substrate and a polycrystalline SiC plate to each other so as to be fixed, and applying heat treatment to the single crystal SiC substrate and the polycrystalline SiC plate under an inert gas atmosphere and under the saturated SiC vapor atmosphere, whereby the polycrystalline SiC plate is solid-phase-transformed into the single crystal, thereby growing a single crystal integrated with the single crystal SiC substrate.

The present invention having the above features does not require a troublesome and expensive preliminary process wherein the single crystal SiC substrate and the polycrystalline SiC plate are ground resulting in high accurate smooth surfaces so that their opposed surfaces may be strictly closely fitted, or they are finished to be smooth so that the whole surfaces may be completely fitted to each other. The single crystal SiC substrate and the polycrystalline SiC plate which have low accurate smooth surface are used, and both substrate and plate are simply laminated to each other for fixation so as to apply heat treatment thereto, whereby the single crystallization owing to solidphase transformation of a whole layer surface of the polycrystalline SiC plate and the single crystallization in surface direction wherein the contact point functions as a starting point, thus making a whole layer surface of the polycrystalline SiC plate grow efficiently into a single crystal integrated with the single crystal SiC substrate so that it may be possible to obtain the single crystal SiC having high quality, which is substantially free from lattice defects and micropipe defects, with high productivity. Therefore, the single crystal SiC is expected as a semiconductor material for a power device, which is more superior in view of a large capacity, a high frequency, a high dielectric strength, and a high resistance to environments, to existing semiconductor materials such as Si (silicon) and GaAs (gallium arsenide). This can expedite the practical use of the single crystal.

The other features and advantages of the present invention will become more apparent from the following description of preferred embodiments.

PREFERRED EMBODIMENTS OF THE INVENTION

Figure 1:
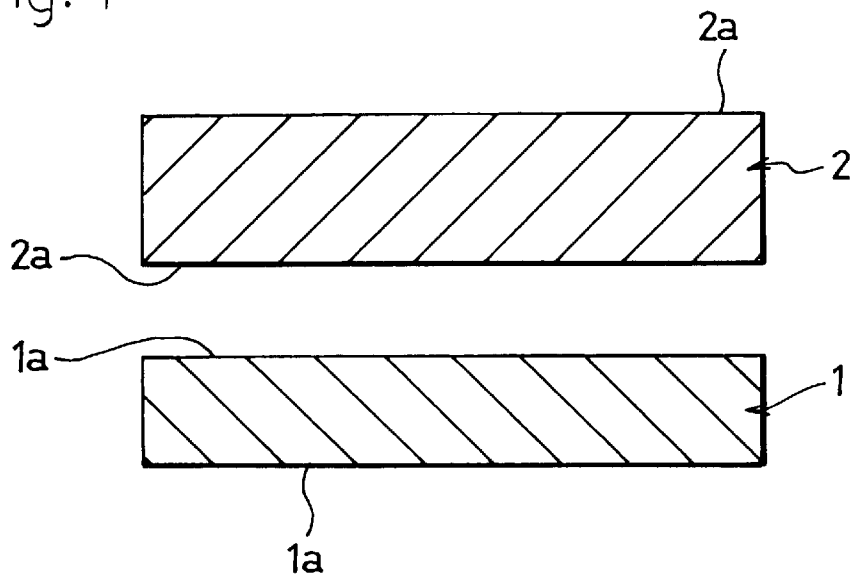
FIG. 1 is a diagram of a material employed in producing a single crystal SiC according to the present invention.

Referring now to the drawing, preferred embodiments of the present invention are described below.

Figure 5:
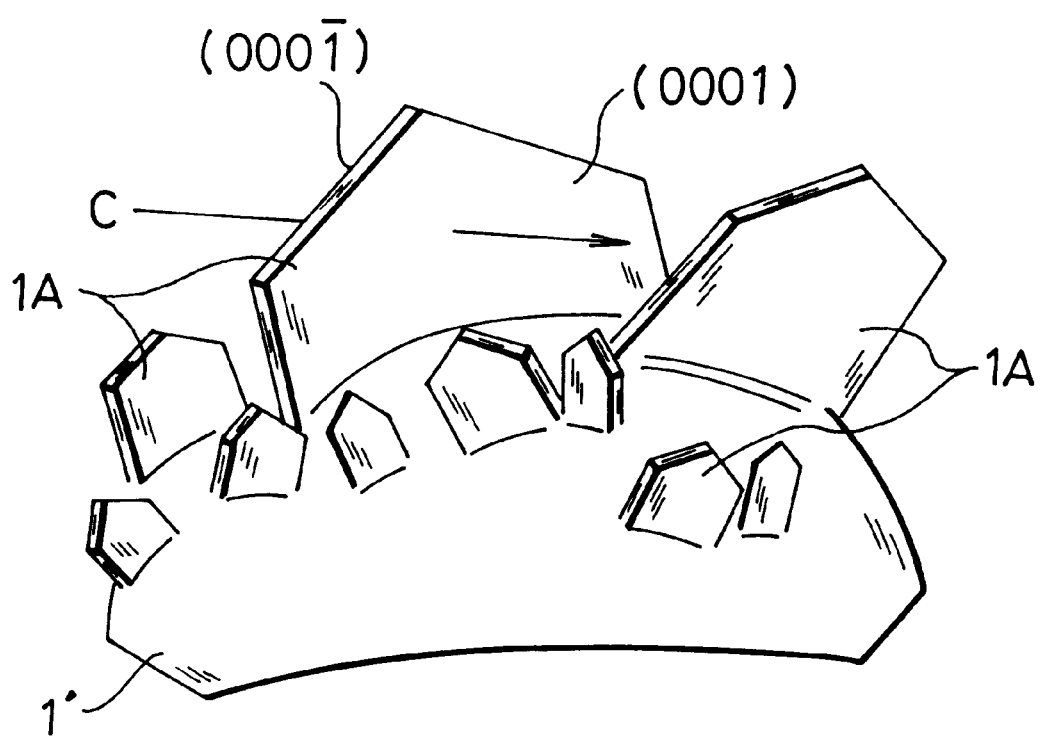
FIG. 5 is a schematic perspective view of a single crystal α-SiC lump produced in making the single crystal SiC substrate employed in production of the single crystal SiC.

FIG. 1 is a diagram of a material employed in producing a single crystal SiC according to the present invention. In FIG. 1, 1 designates a single crystal hexagonal α-SiC substrate (6H type or 4H type), which is formed so as to have each plate-shaped SiC, in cutting out numbers of plate-shaped single crystal SiC pieces 1A from a single crystal α-SiC lump 1' produced by the Acheson method as shown in FIG. 5 and U.S. Pat. No. 4,419,336 and U.S. Pat. No. 4,686,032, top and back surfaces 1a, 1a thereof are processed, thereby being formed so as to have a thickness of 0.5 mm, so that (0001) surface of each plate-shaped single crystal SiC piece 1A may function as a vertical axis.

2 designates a polycrystalline cubic β-SiC plate produced separately by thermal chemical vapor deposition (hereinafter referred to as thermal CVD) at a temperature in a range of 1300 to 1900° C. In the polycrystalline β-SiC plate 2, a β-SiC film having a thickness of substantially 1 mm, whose (111) surface is highly orientated is produced on a sintered graphite not shown in the figure by thermal CVD. Thereafter, the graphite is incinerated for removal, thus isolating both surfaces 2a, 2a of a flat plate-shaped material having a thickness of 0.8 mm, which are ground so as to achieve a smooth surface equal to or lower than 1,000 angstroms RMS, preferably 50 angstroms RMS.

The flat plate-shaped polycrystalline β-sic plate 2 and the single crystal and the single crystal α-SiC substrate 1 produced in the above way, are washed by a solvent, a supersonic wave, or hydrofluoric acid so as to dry them, before both substrate and plate 1, 2 are laminated to each other for fixation so as to be closely fitted.

Figure 2:
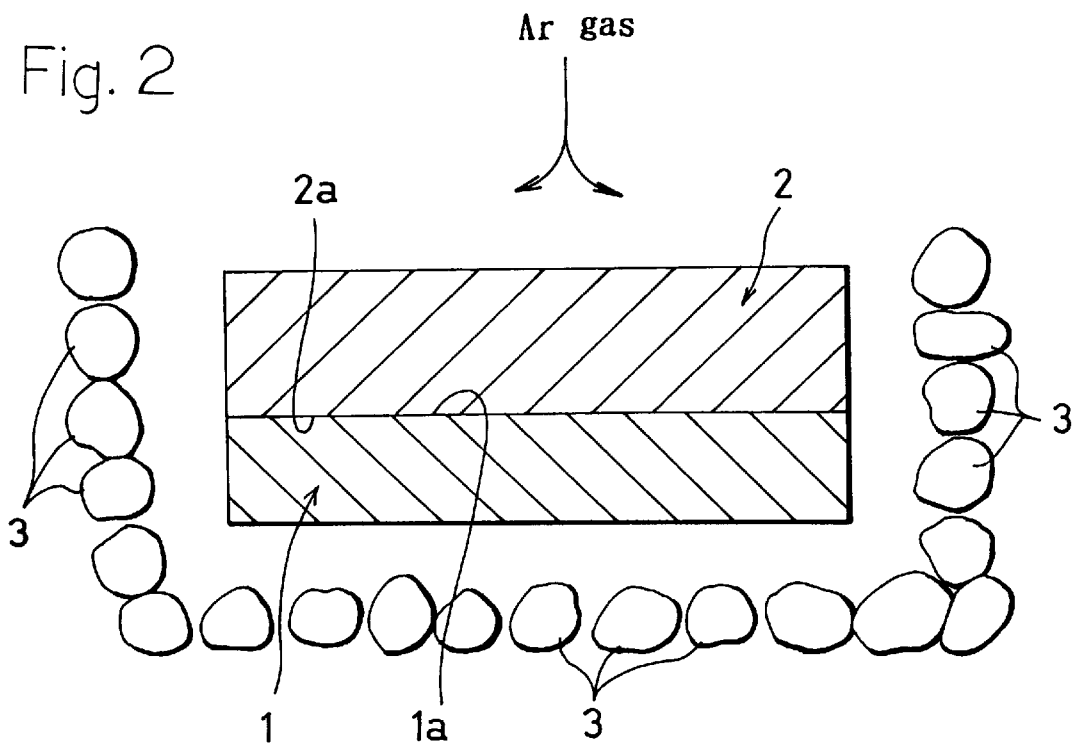
FIG. 2 is a diagram showing a state before a first step (i.e., a heat treatment step) in steps of producing the single crystal SiC according to the present invention.

In such a state, as shown in FIG. 2, the single crystal α-SiC substrate 1 and the polycrystalline β-sic plate 2 which are laminated to each other for fixation are horizontally inserted and arranged inside a carbon resistance-heat furnace (not shown), single crystal α-SiC grains 3 are arranged and filled at a periphery thereof. An inert gas flow such as Ar is injected into the furnace to the extent of 1 atom, so that a temperature of a center of the furnace is raised from 1,100° C. up to 2,000 to 2,300° C. at an average velocity by taking 10 hours, and it is kept at 2,000 to 2,300° C. for substantially 5 hours. Thus, a first heat treatment is applied thereto under an inert gas atmosphere and a saturated SiC vapor atmosphere.

Figure 3:
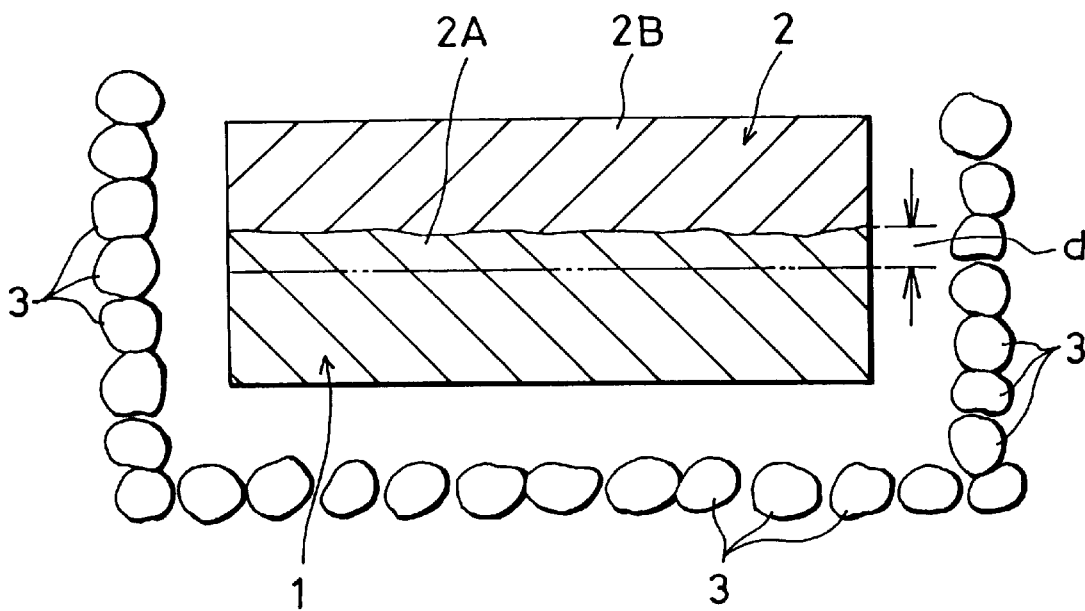
FIG. 3 is a diagram showing a state when the first heat treatment in the first step (i.e., the heat treatment step) is completed.

By this first heat treatment, as shown in FIG. 3, the polycrystalline β-SiC plate 2 is solid-phase-transformed, thus leading to single crystallization of the polycrystalline β-SiC plate portion 2A, whose depth range d is 100 to 50 μm all over a layer surface.

Figure 4:
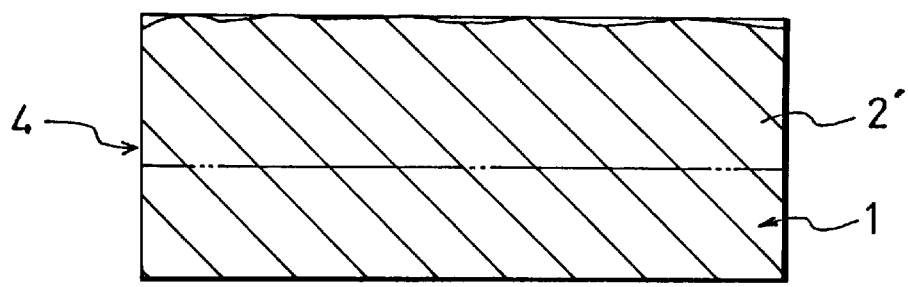
FIG. 4 is a diagram showing a state when a last heat treatment in the first step (i.e., the heat treatment step) is completed.

After first heat treatment, the heat treatments are repeated under the same atmosphere and temperature conditions as the above mention, whereby the above single-crystallized portion 2A is solid-phase grown as a seed crystal, thereby transforming the rest of the polycrystalline β-SiC plate portion 2B into single crystals so as to lead to the single crystal portion 2' oriented in the same direction as the crystal axis of the single crystal α-SiC substrate 1. Consequently, the single crystal portion 2' is integrated with the single crystal of the single crystal α-SiC substrate 1, thereby growing them into a large sized single crystal SIC 4 as shown in FIG. 4.

In the above embodiment, the opposite faces 1a, 2a of the single crystal α-Sic substrate 1 and the polycrystalline β-SiC plate 2 are ground so as to have smooth surfaces equal to or lower than 1,000 angstroms RMS, preferably, 50 angstroms RMS. Under a condition wherein the smooth surfaces are closely laminated all over the mutual surfaces, they are subjected to a heat treatment. Alternatively, even though both opposed surfaces 1a, 2a are not strictly closely fitted, and the opposed surfaces 1a, 2a are not entirely finished as the flat surfaces so that they are not completely contacted to each other, only a partial contact point advances single crystallization owing to solid-phase transformation to a surface direction wherein the contact point is a starting point, whereby a whole of the polycrystalline β-SiC plate 2 is single-crystallized. This has been confirmed by an experiment.

Therefore, it does not require a troublesome and expensive preliminary process wherein the single crystal α-SiC substrate 1 and the polycrystalline β-SiC plate 2 are ground resulting in the high accurate smooth surfaces so that the opposed surfaces 1a, 2a may be strictly closely fitted, or they are finished to be smooth so that the whole surfaces may be completely fitted to each other. The single crystal α-SiC substrate 1 and the polycrystalline β-SiC plate 2 having low accurate smooth surfaces are used, and the both substrate and plate 1, 2 are simply laminated each other for fixation so as to apply heat treatment thereto, a whole area of the polycrystalline β-SiC plate 2 is single-crystallized, whereby it is possible to produce single crystal SiC having high quality with high productivity, which are substantially free from lattice defects and micropipe defects.

As the polycrystalline SiC plate, as shown in the above embodiment, the plate-shaped SiC produced by thermal chemical vapor deposition is employed, which the polycrystalline SiC plate itself has high purity and no defects such as a void. Therefore, between the single crystal SiC substrate and the polycrystalline SiC plate, crystal grain boundaries or the like are not formed, thus enhancing the quality of single crystal SiC further. However, it is not limited to the above. Alternatively, a plate-shaped SiC produced by an ion plating method, spattering method and plasma CVD may be used.

Moreover, as shown in the above embodiment, preferably, single crystal α-SiC is used as the single crystal SiC substrate. Alternatively, the single crystal β-SiC may be used. Especially, in case of employing the single crystal SiC substrate having a crystal surface opposed to the polycrystalline SiC plate, which is (0001) surface ±5° or (110) surface ±5° of the single crystal SiC piece cut out in a plate shape from the single crystal SiC lump produced by the Achison method, the single crystal is grown from the crystal surface of the single crystal SiC substrate to a C axial direction by solid-phase transformation of the polycrystalline SiC plate accompanied with the heat treatment. In the growing step, introduction of crystal defects are extremely reduced, thereby growing the crystal of the same polymorphous structure as the single crystal SiC substrate easily and surely. As a result, the high quality single crystal SiC in which another polymorphous structure is not mixed can be efficiently obtained.

Furthermore, the single crystal α-SiC substrate 1 employed in the above embodiment may be either of a single crystal 6H-SiC or a single crystal 4H-SiC. Moreover, in the above embodiment, the polycrystalline β-SiC film 2 as the polycrystalline plate is employed. Alternatively, even though an amorphous plate having high purity (equal to or less than $10^{14}$ atm/cm$^3$) is employed, the single crystal SiC having high quality similar to the above one can be obtained.

What is claimed is:

1. Single crystal SiC, characterized in that, in a state wherein a single crystal SiC substrate and a polycrystalline SiC plate were laminated to each other so as to be fixed, the single crystal SiC substrate and the polycrystalline SiC plate were subjected to heat treatment under an inert gas atmosphere having a pressure equal to or lower than atmospheric pressure and under a saturated SiC vapor atmosphere, whereby the polycrystal fine SiC plate was solid-phase-transformed into the single crystal, thereby growing a single crystal integrated with the single crystal SiC substrate.

2. Single crystal SIC according to claim 1, wherein another SIC produced by thermal chemical vapor deposition so as to have a plate shape, apart from the single crystal SiC substrate, was used as the polycrystalline SIC plate.

3. Single crystal SiC according to claim 2, wherein a layer surface of the plate-shaped polycrystalline SIC plate produced by thermal chemical vapor deposition was ground so as to have smoothness equal to or lower than 1,000 angstroms RMS.

4. Single crystal SiC according to claim 1, wherein the employed single crystal SiC substrate has a crystal surface opposed to the polycrystalline SiC plate, the crystal surface being (0001) surface ±5° or (110) surface ±5° of a single crystal SiC piece cut out in a plate shape from a single crystal SiC lump produced by Achison method.

* * * * *

UNITED STATES PATENT AND TRADEMARK OFFICE
CERTIFICATE OF CORRECTION

PATENT NO. : 6,187,279 B1
DATED : February 13, 2001
INVENTOR(S) : Kichiya Tanino et al.

It is certified that error appears in the above-identified patent and that said Letters Patent is hereby corrected as shown below:

<u>Claim 1,</u>
Line 15, "polycrystal fine" should be "polycrystalline".

Signed and Sealed this

Seventh Day of August, 2001

*Attest:*

*Attesting Officer*

NICHOLAS P. GODICI
*Acting Director of the United States Patent and Trademark Office*